(12) United States Patent
Knoop et al.

(10) Patent No.: US 10,644,494 B2
(45) Date of Patent: May 5, 2020

(54) PROTECTIVE ARRANGEMENT

(71) Applicant: Phoenix Contact GmbH & Co. KG, Blomberg (DE)

(72) Inventors: Daniel Knoop, Paderborn (DE); Lars Alsdorf, Soest (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 295 days.

(21) Appl. No.: 15/560,494

(22) PCT Filed: Feb. 19, 2016

(86) PCT No.: PCT/EP2016/053529
§ 371 (c)(1),
(2) Date: Sep. 22, 2017

(87) PCT Pub. No.: WO2016/150628
PCT Pub. Date: Sep. 29, 2016

(65) Prior Publication Data
US 2018/0062375 A1    Mar. 1, 2018

(30) Foreign Application Priority Data
Mar. 26, 2015  (DE) ......................... 10 2015 104 623

(51) Int. Cl.
  *H02H 3/08* (2006.01)
  *H02H 3/00* (2006.01)
  (Continued)

(52) U.S. Cl.
  CPC ............ *H02H 3/08* (2013.01); *G01R 19/165* (2013.01); *G08B 5/36* (2013.01); *G08B 7/06* (2013.01); *G08B 21/182* (2013.01); *H02H 3/006* (2013.01)

(58) Field of Classification Search
  CPC ............... H02H 3/00; H02H 3/08; H02H 7/30
  (Continued)

(56) References Cited

U.S. PATENT DOCUMENTS 5,214,559 A  *  5/1993  Zerbian ............... H01H 1/0015
                                                        318/490
6,141,202 A  *  10/2000  Maeckel ............... H01H 85/46
                                                        337/143

(Continued)

FOREIGN PATENT DOCUMENTS

AT          506092 B1     6/2009
CN       102265475 A     11/2011
  (Continued)

*Primary Examiner* — Tuan T Dinh
(74) *Attorney, Agent, or Firm* — Leydig, Voit & Mayer, Ltd.

(57) ABSTRACT

A protective arrangement for protecting an electrical device against an overload current includes: an input at which a current is supplied to the protective arrangement by a power supply; an output via which the current (I) is transferred in the form of an output current to the electrical device; a safety switch in a power line between the input and the output, which safety switch disconnects the power line when a set tripping current is exceeded; and a current sensor which measures the current ($I_{actual}$) in the power line when the electrical device is connected, the current sensor being able to set the tripping current, on the basis of the measured current ($I_{actual}$), to a value that is greater than the measured current ($I_{actual}$) by a specified difference ($\Delta I$).

13 Claims, 10 Drawing Sheets

(51) Int. Cl.
  *G01R 19/165* (2006.01)
  *G08B 5/36* (2006.01)
  *G08B 7/06* (2006.01)
  *G08B 21/18* (2006.01)

(58) Field of Classification Search
  USPC .................. 361/93.1, 83, 87, 94, 103–104
  See application file for complete search history.

(56) References Cited

U.S. PATENT DOCUMENTS

| | | | |
|---|---|---|---|
| 6,603,649 B1* | 8/2003 | Muller | H02H 7/30 |
| | | | 361/93.3 |
| 7,173,428 B2* | 2/2007 | Hurwicz | G01R 31/3272 |
| | | | 324/424 |
| 8,319,465 B2 | 11/2012 | Franke et al. | |
| 2003/0090271 A1* | 5/2003 | Hurwicz | G01R 31/3272 |
| | | | 324/424 |
| 2011/0141643 A1 | 6/2011 | Hummel et al. | |
| 2011/0242716 A1 | 10/2011 | Ueta et al. | |
| 2013/0006478 A1 | 1/2013 | Lin | |
| 2014/0327995 A1* | 11/2014 | Panjwani | H02H 3/05 |
| | | | 361/93.1 |

FOREIGN PATENT DOCUMENTS

| | | |
|---|---|---|
| DE | 19620575 A1 | 11/1997 |
| DE | 19811956 A1 | 9/1999 |
| DE | 202004014589 U1 | 4/2005 |
| DE | 102004046810 A1 | 4/2006 |
| DE | 102007013551 A1 | 9/2008 |
| WO | WO 2004109885 A2 | 12/2004 |

\* cited by examiner

PROTECTIVE ARRANGEMENT

CROSS-REFERENCE TO PRIOR APPLICATIONS

This application is a U.S. National Phase application under 35 U.S.C. § 371 of International Application No. PCT/EP2016/053529, filed on Feb. 19, 2016, and claims benefit to German Patent Application No. DE 10 2015 104 623.7, filed on Mar. 26, 2015. The International Application was published in German on Sep. 29, 2016 as WO 2016/150628 A1 under PCT Article 21(2).

FIELD

The invention relates to a protective arrangement for protecting electrical devices against an overload current.

BACKGROUND

A protective arrangement of the type in question comprises an input at which a current is supplied to the protective arrangement by a power supply, and an output via which the current can be transferred in the form of an output current to the electrical device to be protected in order to supply said device with power. Here, the protective arrangement comprises a fuse in the power line between the input and the output, which fuse disconnects the power line from the input to the output in order to protect the device against an overload current when a previously set tripping current is exceeded.

DE 20 2004 014 589 U1 discloses an electronic safety switch having a tripping characteristic that can be set which triggers a tripping or cut-out process in the event of increased power consumption. It is described in paragraph 34 of DE 20 2004 014 589 U1 that the desired tripping characteristics can be input and selected using a man-machine interface.

It is often problematic to set the tripping characteristics, in particular the tripping current, to the operationally different supply currents of the electrical devices to be connected. If the set value for the tripping current is too high, a connected device cannot be reliably protected against overloading, since even if the prevailing current significantly exceeds the typical consumed current (rated current) of the connected device, the fuse does not trip.

SUMMARY

In an embodiment, the present invention provides a protective arrangement for protecting an electrical device against an overload current, comprising: an input at which a current is supplied to the protective arrangement by a power supply; an output via which the current is transferred in the form of an output current to the electrical device; a safety switch in a power line between the input and the output, which safety switch is configured to disconnect the power line when a set tripping current is exceeded; and a current sensor configured to measure the current in the power line when the electrical device is connected, the current sensor being configured to set the tripping current, on the basis of the measured current, to a value that is greater than the measured current by a specified difference.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the protective arrangement comprises a current sensor which measures the current in the power line when a device is connected, it being possible to set the tripping current for the safety switch, on the basis of the measured current, to a value that is greater than the measured current by a difference.

For this purpose, the protective arrangement preferably comprises an analysis and control unit to which the measured current is supplied, the analysis and control unit automatically setting the value for the tripping current on the basis of the measured current.

In this way, the tripping current is optimally adapted to the consumed current that is currently flowing through the connected device by it being possible to set a value for the tripping current that corresponds to the currently flowing device current plus a difference, a value of 25% of the device current flowing in each case being used for the difference, for example.

In an advantageous embodiment, a solution for developing existing protective arrangements is given which has the option of manually setting the tripping current of the safety switch, and this manual setting option is also intended to be part of the protective arrangement. In this embodiment, in addition to the manual setting unit using which the tripping current can be decreased or increased incrementally or continuously between an upper and a lower value in a setting mode, the protective arrangement comprises an optical and/or acoustic feedback signal unit. Here, using a first signal form, the feedback signal unit gives the user feedback on whether a threshold value determined on the basis of the value set for the tripping current in each case is greater than the current measured by the current sensor, while, using a second signal form that is different from the first signal form, said feedback signal unit gives the user feedback on whether the threshold value determined on the basis of the value set for the tripping current in each case is less than the measured current. In this way, the user can iteratively select an optimal tripping current using the manual setting unit and taking into account the feedback signals. The tripping current selected in this way can then preferably be confirmed by the user using a confirmation unit, e.g. a button, for use in the operating mode. Here, the threshold value can correspond to the tripping current multiplied by a factor, preferably of less than 1. The threshold value can also directly correspond to the tripping current set in each case.

Figure 1:
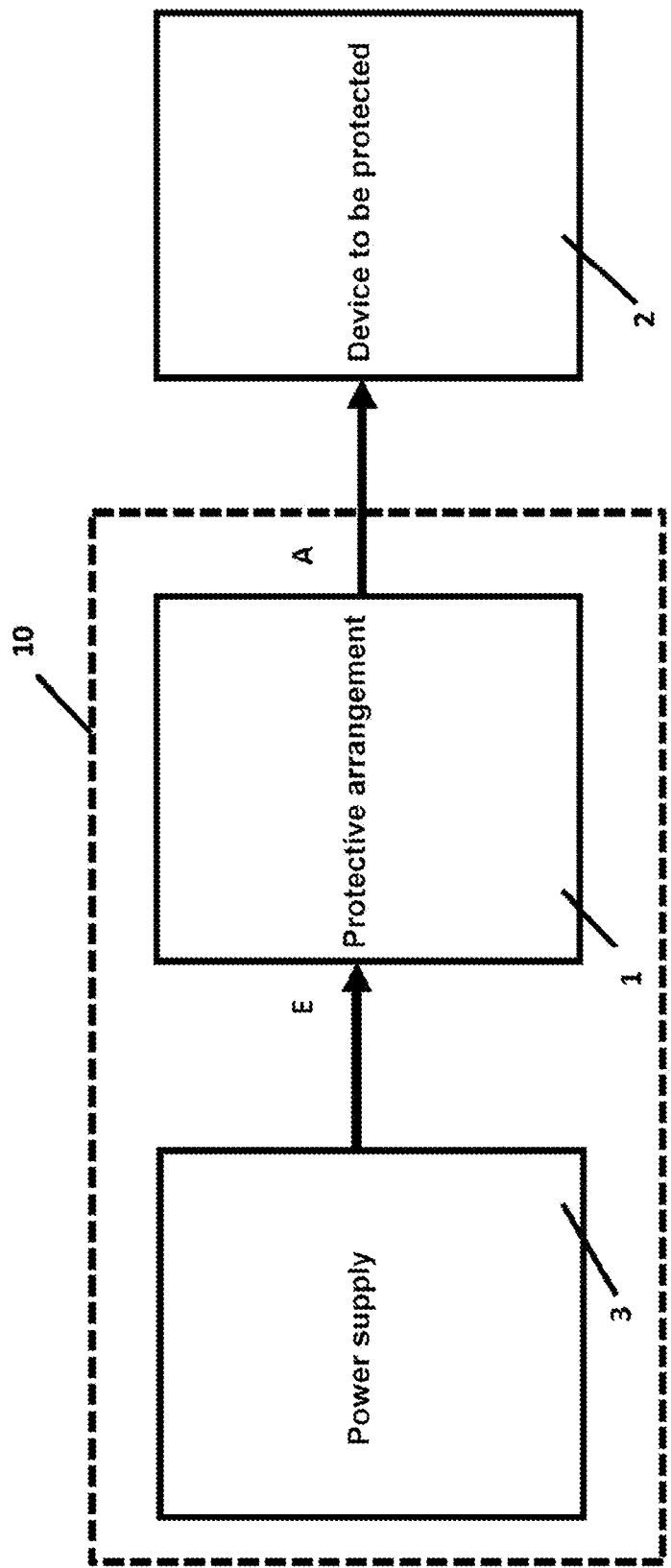
FIG. 1 is a schematic view of the protective arrangement comprising an upstream power supply and a device to be protected.

FIG. 1 is a schematic view of a protective arrangement (1) comprising an upstream power supply (3) and a connected device (2) to be protected. The current provided by the power supply (3) is supplied to the protective arrangement (1) at an input (E). After being conveyed through the protective arrangement (2), this current leaves the protective arrangement (2) at the output (A) in the form of an output current and is transferred to the device (2) that is to be supplied with power and protected. The electrical device may be any type of electrical load, for example a motor.

The power supply (3) and the protective arrangement (1) may be designed as separate modular units that each comprise a separate housing and are for example latched onto a support rail, in particular a top-hat rail, within a switch cabinet. However, it is also provided for the power supply (3) and the protective arrangement (1) to be integrated in a modular unit (10) which can in turn be arranged on a support rail.

Figure 2:
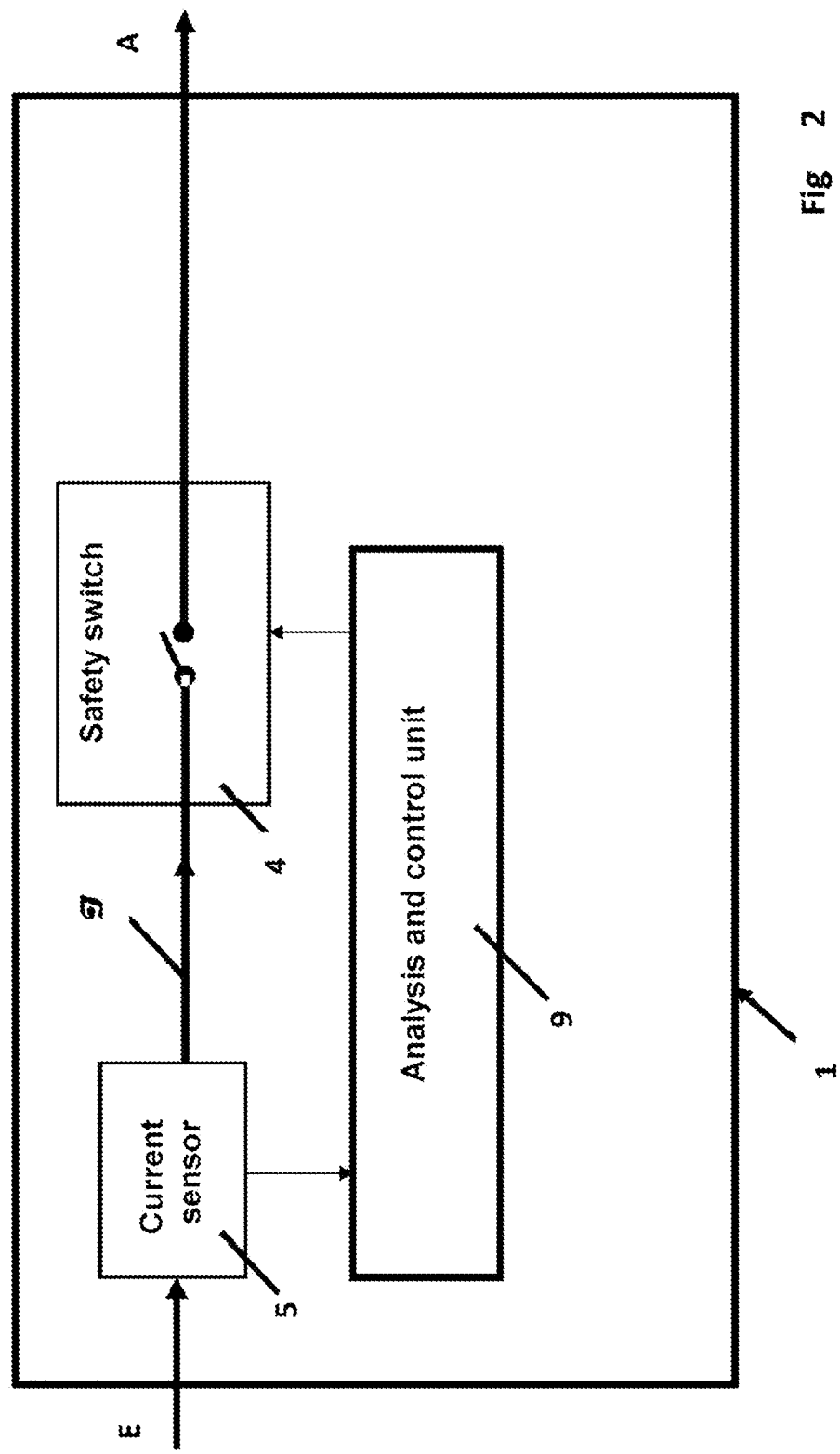
FIG. 2 is a block diagram of the protective arrangement.

FIG. 2 is a block diagram of a protective arrangement (1) which comprises a current sensor (5) in the power line between the input (E) and the output (A). The current sensor (5) measures the current ($I_{actual}$) in the power line when a device (2) is connected. Furthermore, the protective arrangement (1) comprises a safety switch (4). Here, the tripping current for the safety switch (4) is set, on the basis of the measured current ($I_{actual}$), to a value that is greater than the measured current by a difference:

$$I_{tripping\ current} = I_{actual} + \Delta I.$$

For this purpose, the protective arrangement (1) preferably comprises an analysis and control unit (9) to which the measured current ($I_{actual}$) is supplied, the analysis and control unit (9) automatically calculating the value for the tripping current on the basis of the measured current ($I_{actual}$) and, if the measured current ($I_{actual}$) exceeds the tripping current, sending a tripping signal to the safety switch (4).

Figure 3:
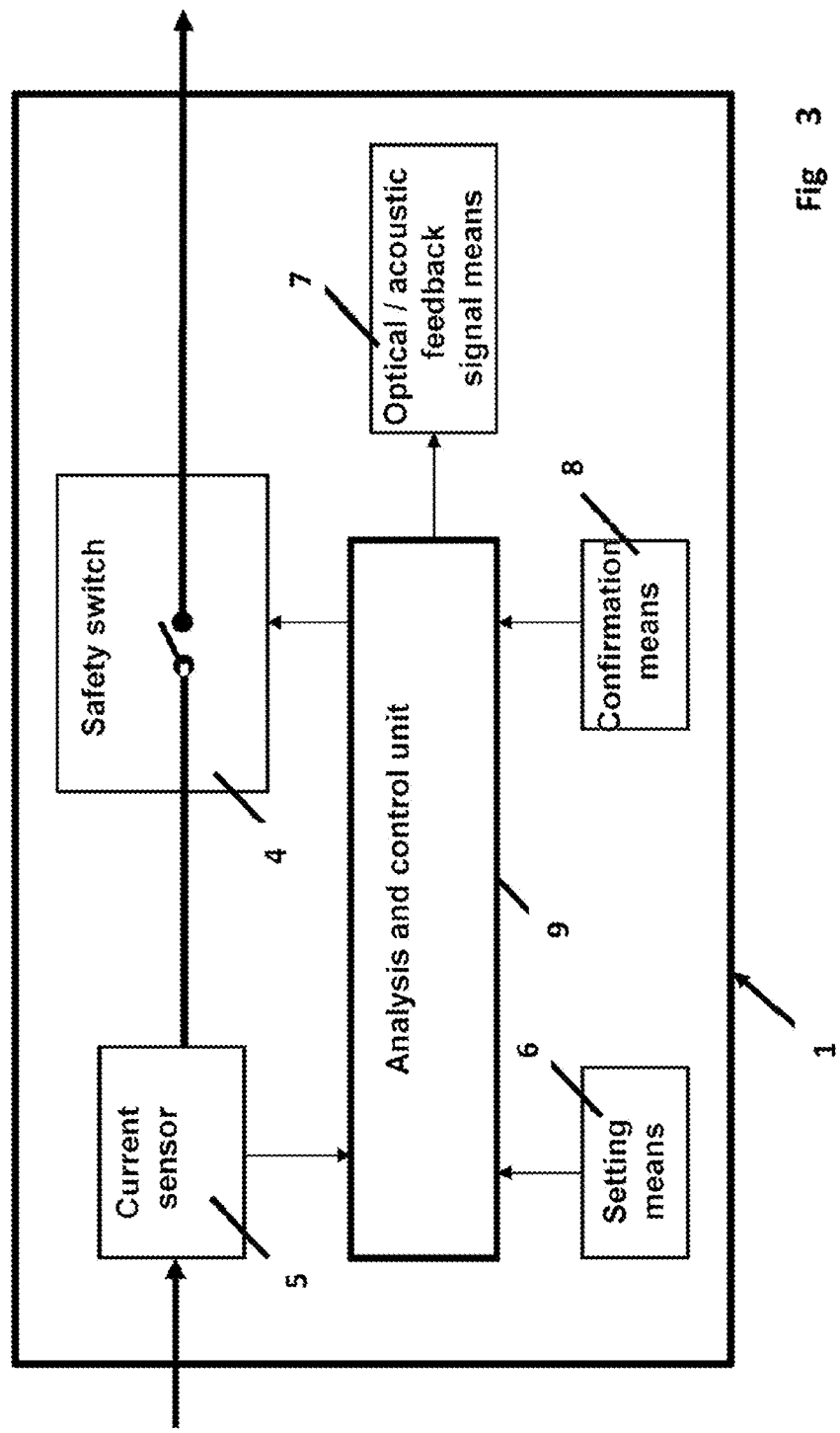
FIG. 3 is a block diagram of the protective arrangement in the embodiment comprising a setting unit, a feedback signal unit and a confirmation unit.

FIG. 3 is a block diagram of the protective arrangement (1) in the embodiment comprising a manually actuated setting unit (6), an optical and/or acoustic feedback signal unit (7) and a manually actuated confirmation unit (8). Using the setting unit (6), in a setting mode, the user is able to increase or decrease the tripping current incrementally or continuously between an upper and a lower value. Using a first signal form, the feedback signal unit (7) gives the user feedback on whether the threshold value determined on the basis of the set value for the tripping current in each case is greater than the measured current ($I_{actual}$), while, using a second signal form that is different from the first signal form, said feedback signal unit gives the user feedback on whether the threshold value determined on the basis of the set value for the tripping current in each case is less than the measured current ($I_{actual}$). Using the confirmation unit (8), a selected value for the tripping current can be confirmed by the user for use in the operating mode. The confirmation unit (8) is not entirely necessary, but is advantageous.

Figure 5:
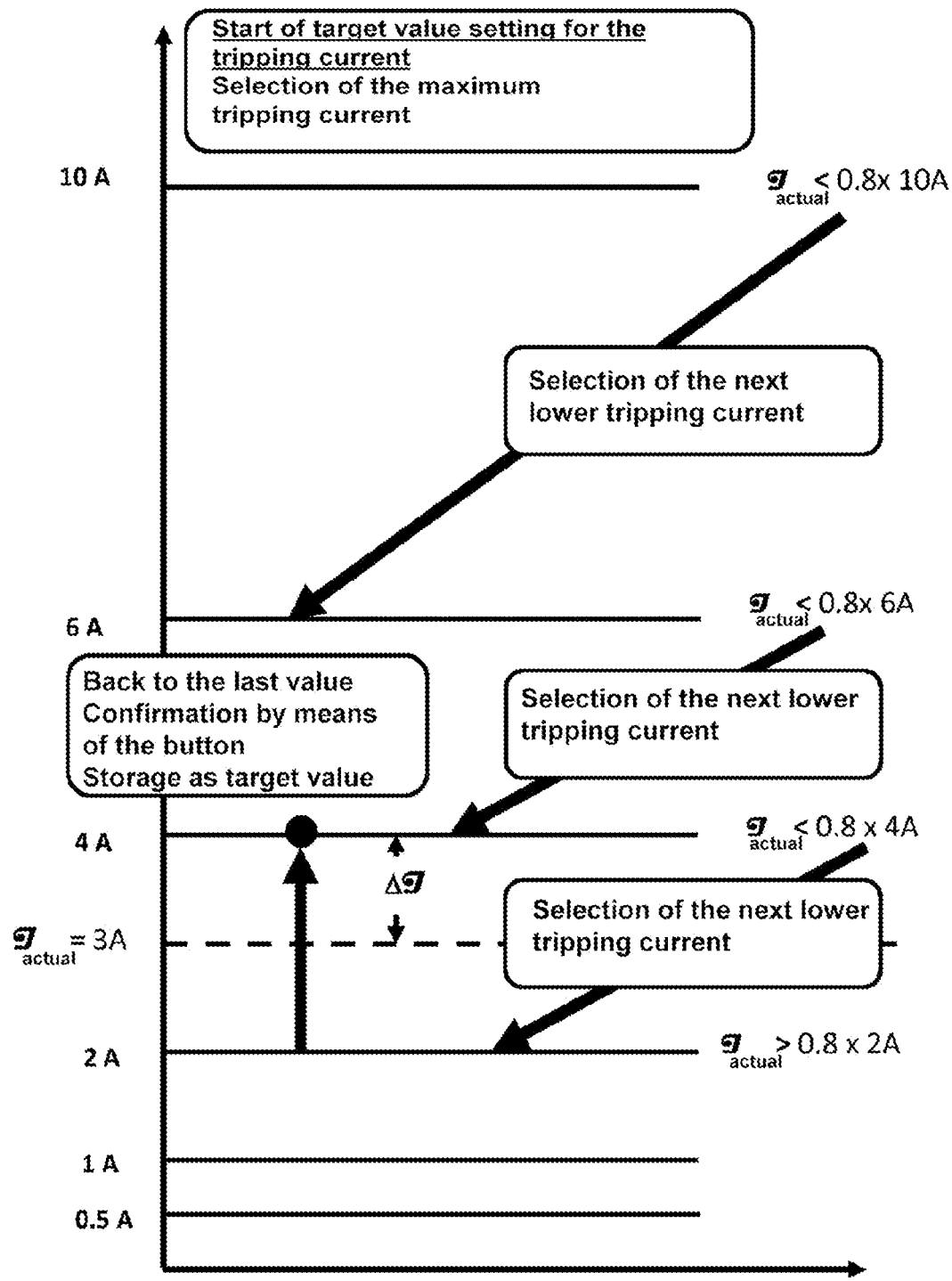

The setting of the optimal tripping current is explained on the basis of FIG. 5. Using a first signal form, the feedback signal unit (7) gives feedback whenever the measured current ($I_{actual}$) is less than e.g. 80% of the set tripping current, i.e. the tripping current is greater than the measured current by at least 25%. Furthermore, using a second signal form, the feedback signal unit (7) gives feedback whenever the measured current ($I_{actual}$) is greater than 80% of the set tripping current. In the present example, the difference $\Delta I$ is thus 25% of the currently flowing current.

In this example, a setting unit (6) is used which makes it possible to set the tripping current incrementally. The current that is currently flowing and is measured by the current sensor (5) is 3 A. To start setting the target value for the tripping current, an upper value of 10 A is set, for example. In order to then start the actual setting according to the invention, it is preferably provided for a setting mode to be activated. This may for example also be carried out by actuating the above-mentioned confirmation unit (8). Here, using a third signal form, the feedback signal unit (7) can indicate to the user that the setting mode is activated. In the setting mode, the previously set maximum value for the tripping current for tripping the safety switch (4) is used until the newly selected, optimized tripping current is confirmed for use in the operating mode as a target value for the tripping current. When the selected tripping current is confirmed, the feedback signal unit (7) again displays the operating mode using the third signal form. In the setting mode, the tripping current set in each case is compared with the currently flowing current and, using the feedback signal unit (7), the user is given feedback on the comparison in order to select the optimal tripping current. However, in the "background", the tripping current set before the start of the setting mode is applicable for tripping the safety switch (4) until the new tripping current is confirmed.

Since the measured current of 3 A is less than 80% of the set tripping current of 10 A, i.e. 3 A<0.8×10 A, the feedback signal unit (7) gives feedback using the first signal form. The user would then decrease the tripping current to the next lower level (6 A) using the setting unit (6). Here, the signal form of the feedback signal unit (7) would not change, since the measured current is still less than 80% of the currently set tripping current. The user would then again decrease the tripping current to the next lower level (4 A). Again, this does not lead to a change in the signal form, since 3 A<0.8×4 A. Only the next decrease in the tripping current to 2 A leads to a change in the signal form, specifically from the first signal form to the second signal form, since the measured current of 3 A is now greater than 80% of the set tripping current, i.e. 3 A>0.8×2 A. This change in the signal form indicates to the user that the previously set value (4 A) is the optimal value for the tripping current in the operating mode of the protective arrangement (1). In order to select this value as the target value for the operating mode, the user would again increase the tripping current from the level 2 A to the next level (4 A) using the setting unit (6), the result again being indicated by a change in the signal form.

Therefore, the tripping of the safety switch (4) is sensitive enough to reliably protect the connected device (2) but is not too sensitive either, so as to prevent unintended cut-outs in non-critical situations. In this case, the current (here 3 A) that is flowing and is measured during the setting typically corresponds at least approximately to the rated current of the device (2). Using the setting unit (6) and the indicated change in signal form, the user can approximate the rated current of the device (2) to be protected in a simple manner and can set the tripping current to a value that is greater than the rated current by a tolerance difference $\Delta I$. In a preferred embodiment, the user also has the option of confirming the optimal tripping current using a confirmation unit (8) for further use in the operating mode of the protective arrangement (1).

In this case, a tripping current of 6 A or even 10 A would be far too high to reliably protect the device (2) having a rated current of 3 A, whereas, for the tripping current of 4 A set according to the invention, reliable protection against overload currents is provided and in addition relatively small fluctuations in the power consumption of the device (2) do not lead to the safety switch (4) being unintentionally tripped in an undesired manner.

As shown in FIG. 3, the protective arrangement comprises an analysis and control unit (9), to which the measured current ($\mathcal{I}_{actual}$) and a signal from the setting unit (6) is supplied, the analysis and control unit (9) actuating the feedback signal unit (7) on the basis of the measured current ($\mathcal{I}_{actual}$) and the signal from the setting unit (6), i.e. by comparing the measured current with the tripping current set in each case.

An optical feedback signal unit (7) is preferably used as the feedback signal unit (7). Here, the first and/or second signal form is characterized by
a) flashing or continuous illumination, and/or
b) a color, and/or
c) a brightness,
the first or the second signal form differing on account of at least one of the above-mentioned characteristics.

An LED is preferably used as the optical feedback signal unit (7), which LED can both flash and be continuously illuminated, and can be illuminated in at least two different colors when accordingly actuated.

Figure 7:
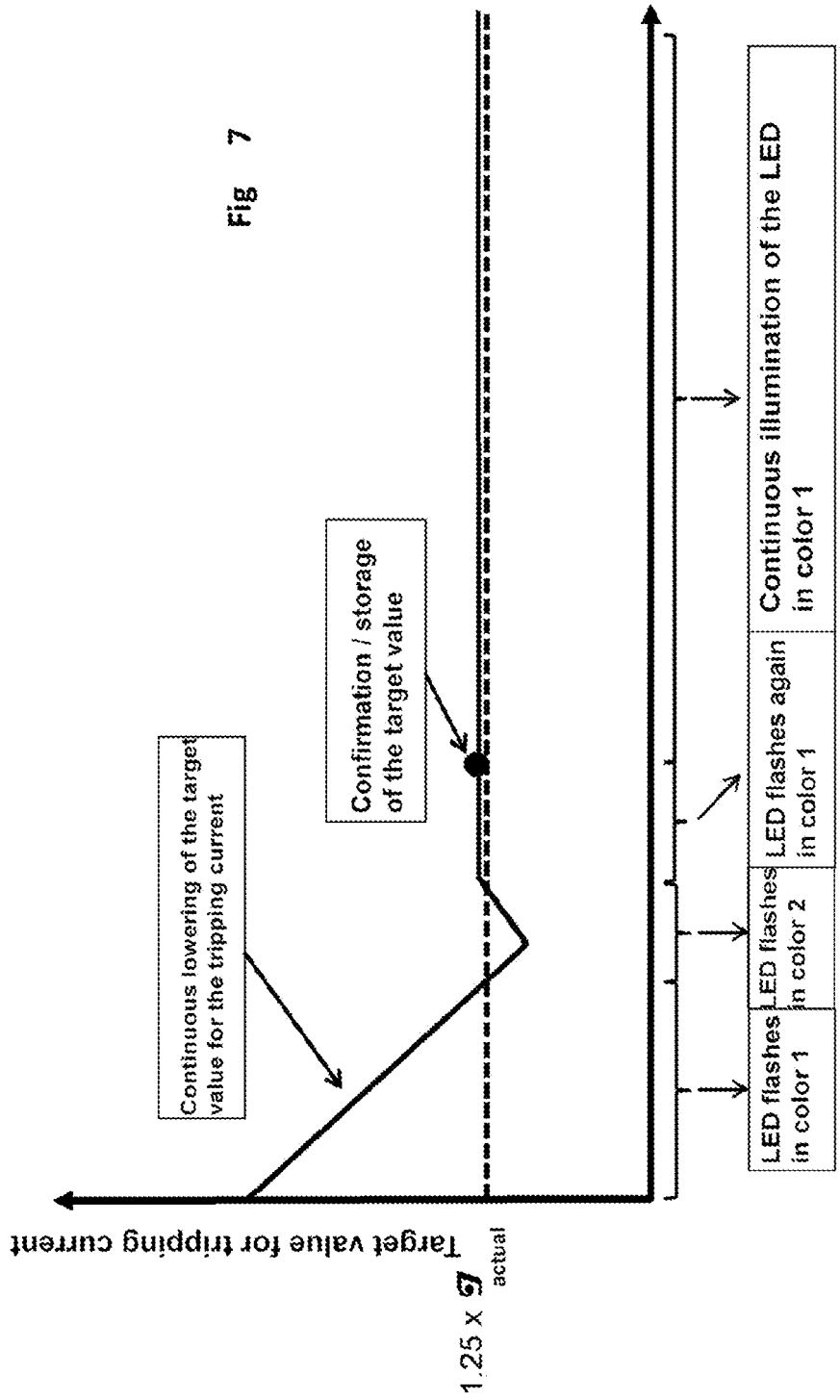
FIG. 7 is a diagram illustrating the manual, continuous setting of the tripping current.

As shown in FIG. 7, the LED illuminates in a first color 1 to indicate the first signal form in which the measured current is less than the tripping current (if applicable, less than the tripping current multiplied by a factor of less than 1), whereas the LED illuminates in a second color to indicate the second signal form when the measured current is greater than the tripping current (if applicable, greater than the tripping current multiplied by a factor of less than 1).

The characteristics "flashing" and "continuously illuminated" are used to indicate, as the third signal form, whether the protective arrangement is in the setting mode.

In flashing operation of the LED (7), the first and the second signal form may also differ in that the LED (7) only flashes in color 1 in the first signal form, while it alternately flashes in color 1 and color 2 in the second signal form.

As an alternative to the optical feedback signal unit, an acoustic feedback signal unit (7) is also provided. Here, the first and/or second signal form is characterized by
a) a recurring sequence of sound pulses or a continuous sound, and/or
b) a pitch, and/or
c) a volume.

Figure 4:
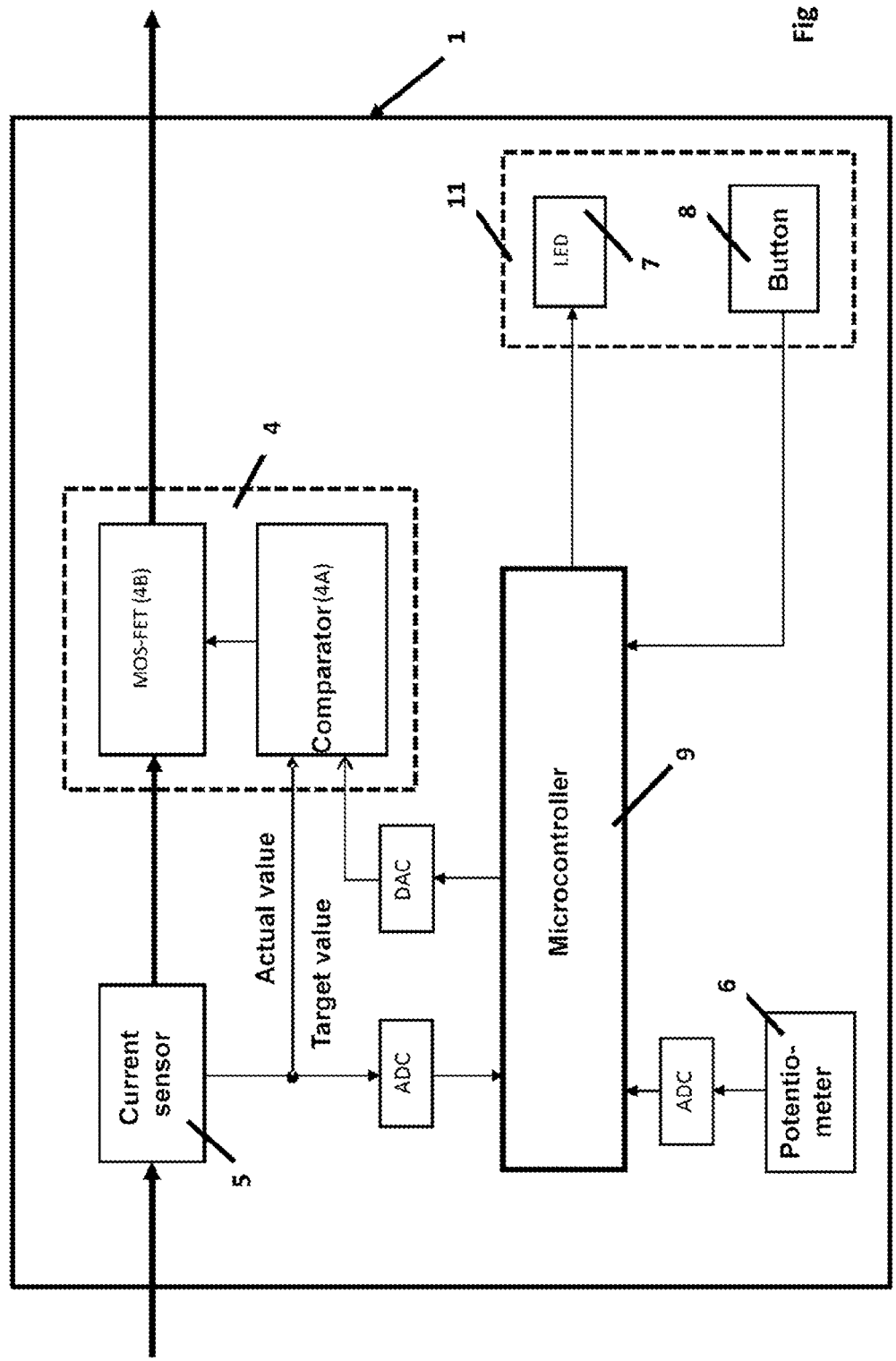
FIG. 4 shows an embodiment of the protective arrangement according to FIG. 3, FIGS. 5 and 6 are diagrams illustrating the manual, incremental setting of the tripping current.
Figure 6:
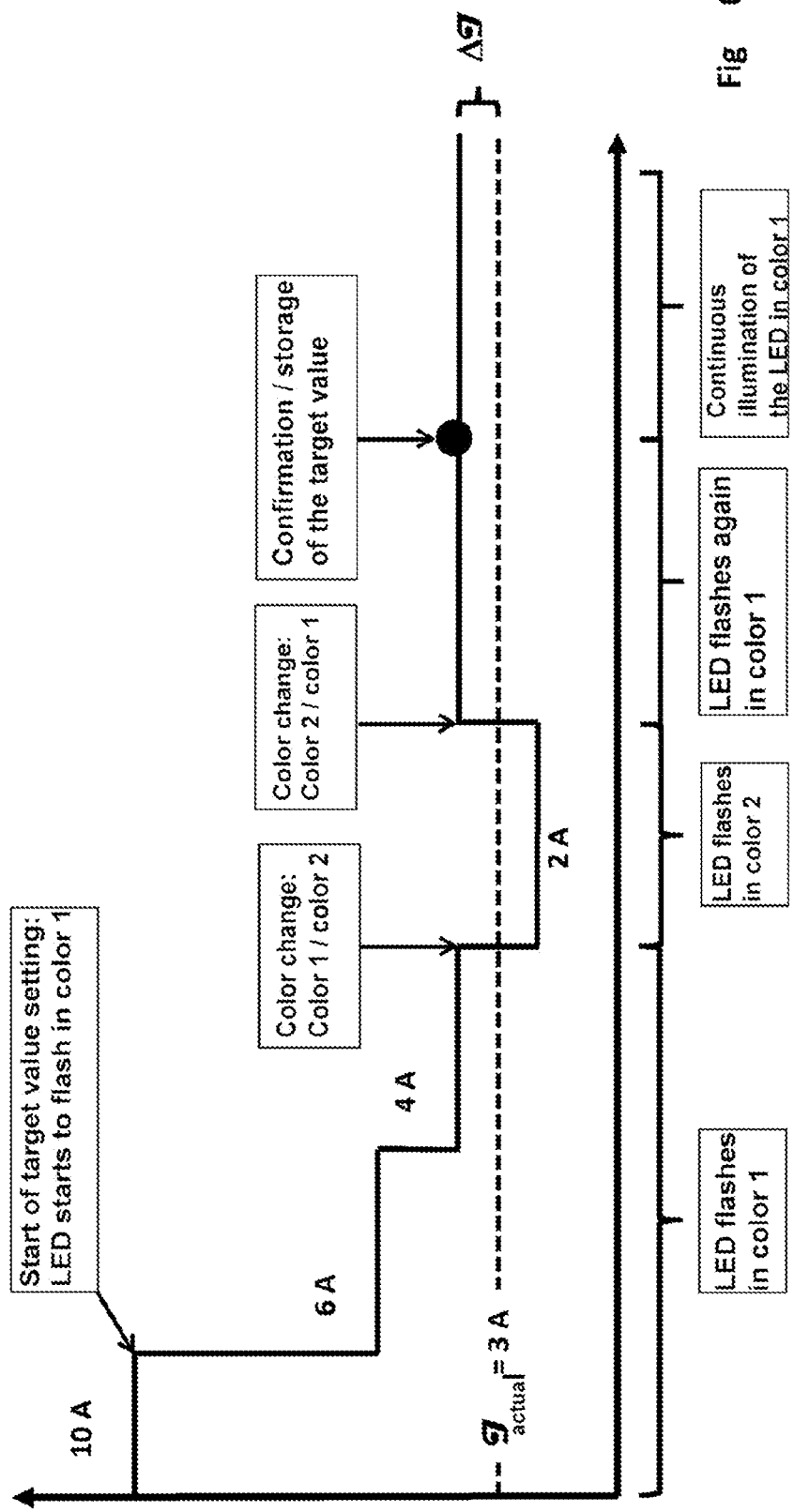

FIG. 4 shows a protective arrangement (1) in which a microcontroller is used as an analysis and control unit (9), an LED is used as an optical feedback signal unit (7) and a potentiometer is used as a setting unit (6) for the tripping current. An electronic switch (4B), preferably a transistor in the form of a MOS-FET, is used in particular as the safety switch (4), and is actuated by a comparator (4A). A potentiometer that can be set incrementally (see FIGS. 6 and 7) or a potentiometer that can be set continuously (see FIG. 8) may be used as the potentiometer (6).

Here, the analog measurement signal from the current sensor (5) is converted into a digital signal by an analog-digital converter (ADC) and is then supplied to the microcontroller (9). Likewise, the analog signal from the potentiometer (6) is supplied to the microcontroller as a digital signal by means of an ADC. A comparison of the measured current ($\mathcal{I}_{actual}$) with the tripping current set by means of the potentiometer (6) then takes place within the microcontroller (9). Depending on the comparison result, the microcontroller (9) then actuates the LED (7) in order to give feedback to the user using the different signal forms ("flashing in color 1", "flashing in color 2", "continuous illumination in color 1").

If the optimal tripping current has been determined by manual setting and optical feedback, said current is confirmed by the user using a confirmation unit (8) designed as a button. This can be carried out for example by pressing the button (8) for a predetermined length of time (e.g. 1 sec). The signal from the button (8) is in turn supplied to the microcontroller (9), which determines the target value for the tripping current on the basis of the current value from the potentiometer (6) when the button (8) is actuated.

On the input side, the measured current ($\mathcal{I}_{actual}$) in the form of an actual value and the tripping current in the form of a target value are supplied to the comparator (4A), the target value being generated on the basis of a signal from the microcontroller and being supplied to the comparator (4A) by a digital-analog converter. On the output side, the comparator (4A) actuates the switch (4B) such that, if the measured current exceeds the tripping current, the switch (4B) opens and disconnects the power line.

Figure 8:
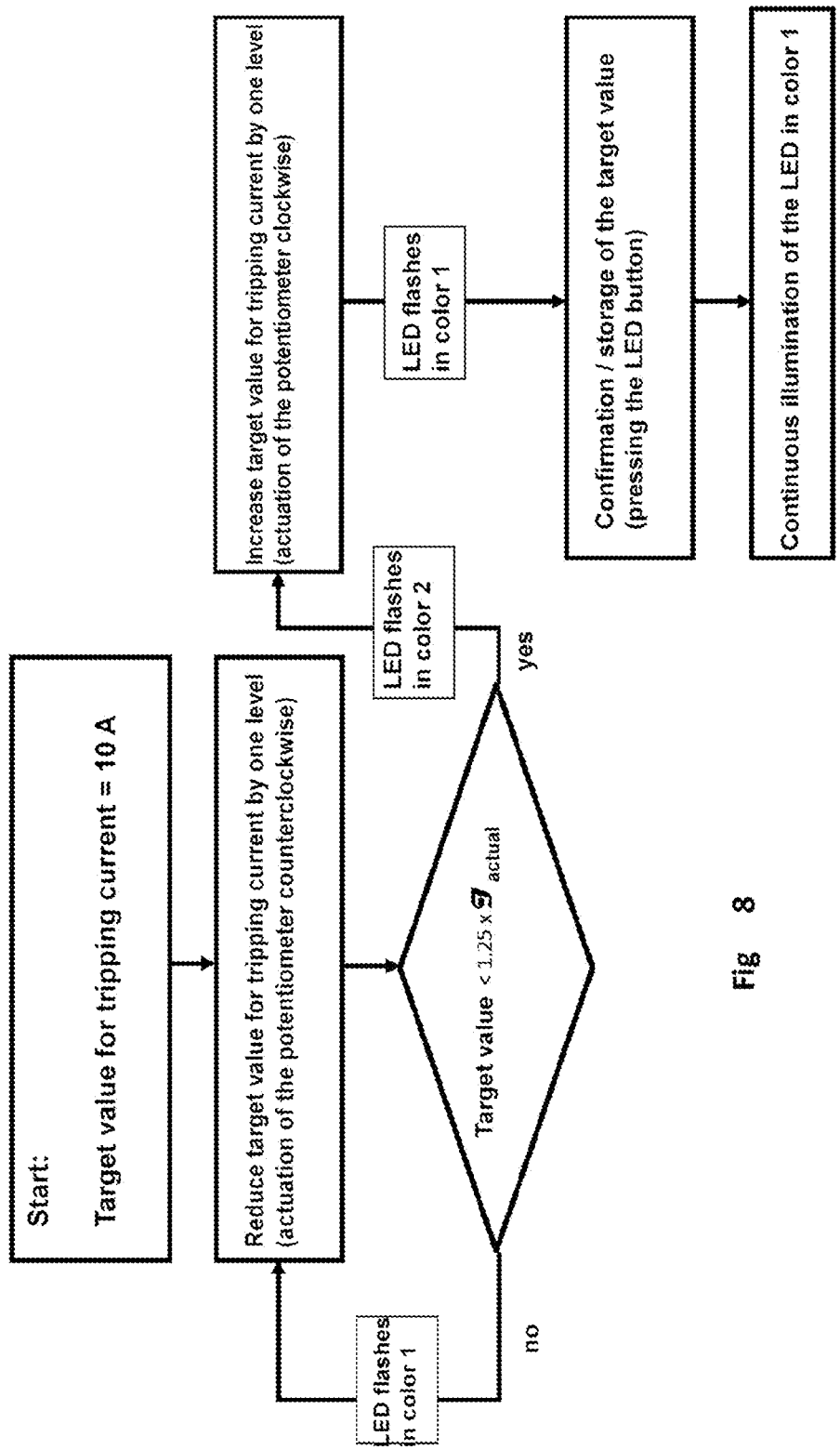
FIG. 8 is a flow diagram illustrating the setting of the tripping current.

FIG. 8 shows the target-value setting of the tripping current, similarly to FIG. 7, but using a setting unit (6) for the tripping current, which makes it possible to continuously set, i.e. decrease or increase, said current.

Figure 9:
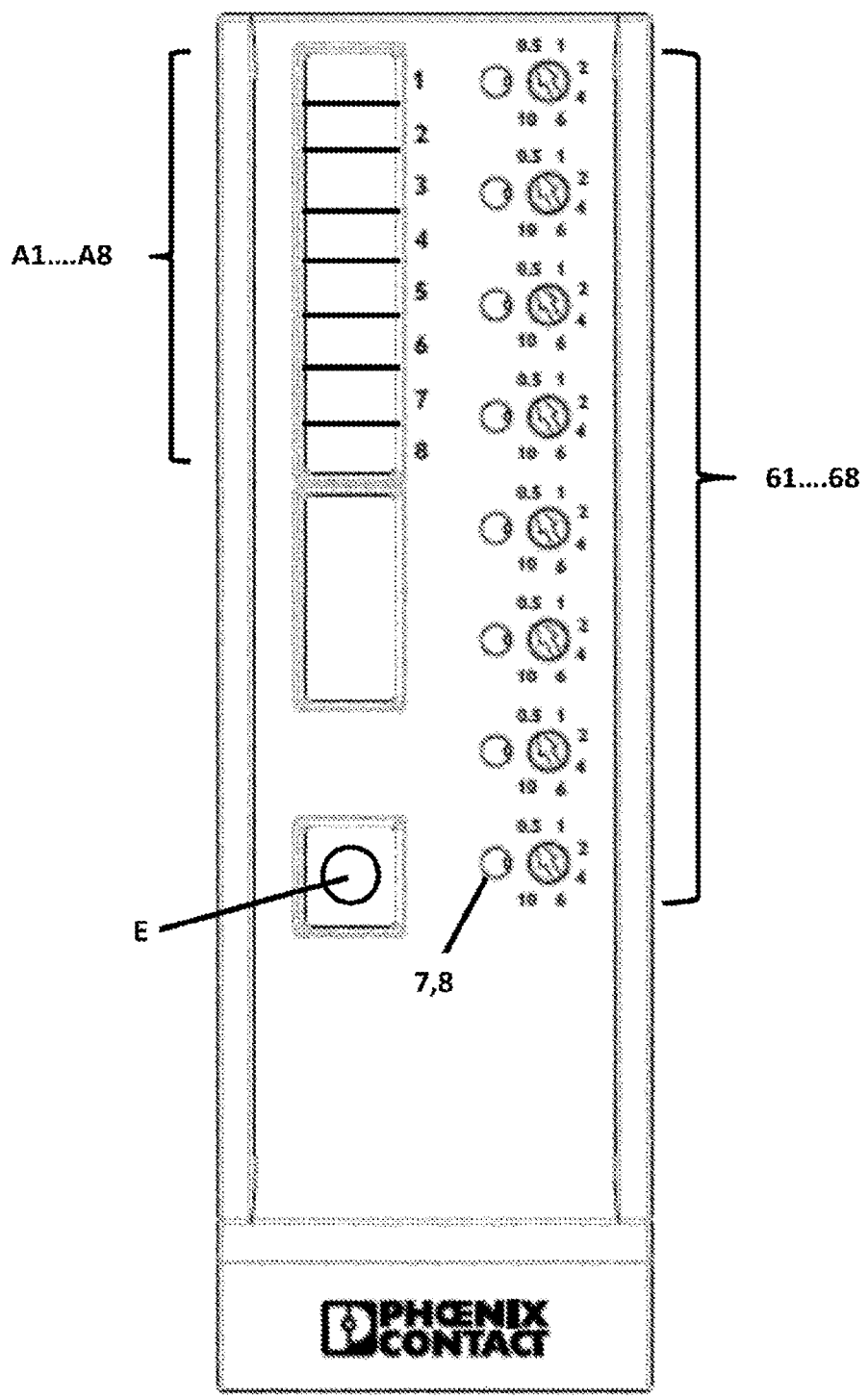
FIG. 9 is a plan view of a front panel of a protective arrangement according to the invention.

FIG. 9 is a flow diagram illustrating the setting of the tripping current.

Figure 10:
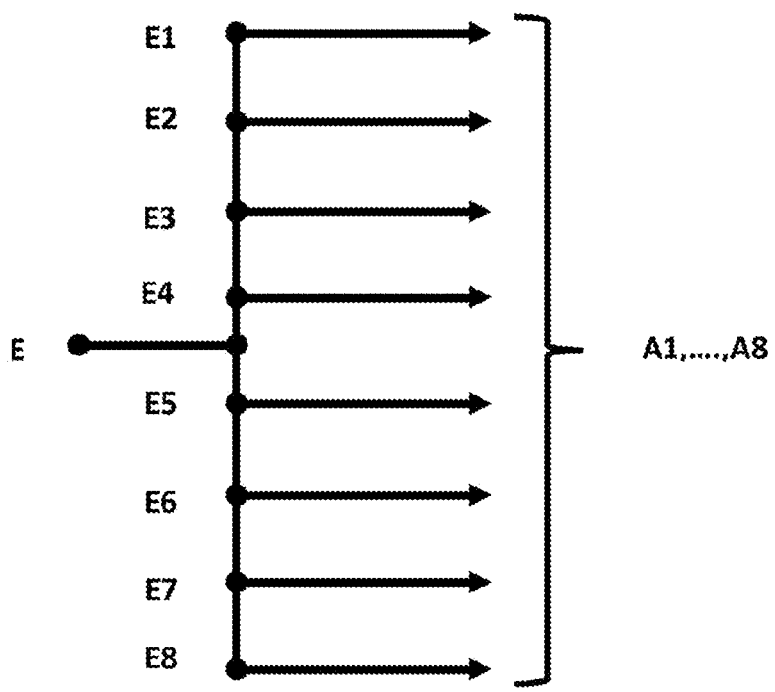
FIG. 10 shows the distribution of a compound current over 8 different channels designed according to the invention.

FIG. 10 is a plan view of a front panel of a protective arrangement (1) according to the invention. This protective arrangement (1) is designed for supplying power to and for protecting a plurality of, for example 8, devices, for which purpose the protective arrangement (1) comprises 8 channels having 8 current outputs (A1, ..., A8). Each channel is assigned a current sensor, a potentiometer (61, ..., 68) for setting the tripping current, as well as an LED (7) and a button (8), the LED (7) and the button (8) each being designed as a modular unit. In this case, the button (8) is actuated by pressing the LED (7). Preferably, the 8 channels share an analysis and control unit. A compound current is supplied to the protective arrangement (1) at a central input (E) and is then divided between the inputs (E1, ..., E8) for the individual channels (see FIG. 11).

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Protective arrangement
2 Electrical device to be protected
3 Power supply
4 Safety switch
4A Comparator
4B MOSFET
5 Current sensor
6, 61, . . . , 68 Setting units
7 Feedback signal unit
8 Confirmation unit
9 Analysis and control unit
10 Modular unit made up of protective arrangement and power supply
11 Modular unit made up of feedback signal unit and confirmation unit
E, E1, . . . , E8 Inputs
A, A1, . . . , A8 Outputs

The invention claimed is:

1. A protective arrangement for protecting an electrical device against an overload current, comprising:
an input at which a current is supplied to the protective arrangement by a power supply;
an output via which the current is transferred in the form of an output current to the electrical device;
a safety switch in a power line between the input and the output, which safety switch is configured to disconnect the power line when a set tripping current is exceeded;
a current sensor configured to measure the current in the power line when the electrical device is connected, the current sensor being configured to set the tripping current, on the basis of the measured current, to a value that is greater than the measured current by a specified difference; and
a manual setting unit configured to decrease or increase the tripping current incrementally or continuously between an upper and a lower value, and further comprising an optical and/or acoustic feedback signal unit which, using a first signal form, is configured to give feedback on whether a threshold value determined on the basis of the value set for the tripping current in each case is greater than the measured current, while, using a second signal form that is different from the first signal form, the feedback signal unit is configured to give feedback on whether the threshold value determined on the basis of the value set for the tripping current in each case is less than the measured current.

2. The protective arrangement according to claim 1, further comprising an actuating unit configured to activate a setting mode for the tripping current.

3. The protective arrangement according to claim 1, further comprising a confirmation unit configured to confirm a selected value for the tripping current for use in an operating mode.

4. The protective arrangement according claim 1, wherein the optical and/or acoustic feedback signal unit comprises an optical feedback signal unit, and wherein the first and/or second signal form includes at least one of:
a) flashing or continuous illumination, or
b) a color, or
c) a brightness,
the first or the second signal form differing on account of at least one of the above-mentioned characteristics.

5. The protective arrangement according to claim 1, wherein the optical and/or acoustic feedback signal unit comprises an acoustic feedback signal unit, and
wherein the first and/or second signal form includes at least one of:
a) a recurring sequence of sound pulses or a continuous sound,
b) a pitch, or
c) a volume,
the first or the second signal form differing on account of at least one of the above-mentioned characteristics.

6. The protective arrangement according to claim 1, wherein, using a third signal form, the feedback signal unit is configured to give feedback on whether the protective arrangement is in a setting mode or an operating mode.

7. The protective arrangement according to claim 1, further comprising an analysis and control unit to which the measured current and a signal from the setting unit are supplied, the analysis and control unit being configured to actuate the feedback signal unit on the basis of the measured current and the signal from the setting unit.

8. The protective arrangement according to claim 1, wherein the manual setting unit comprises a potentiometer.

9. The protective arrangement according to claim 1, wherein the feedback signal unit comprises an LED.

10. The protective arrangement according to claim 7, wherein a signal from the confirmation unit is supplied to the analysis and control unit, the selected value for the tripping current being stored in the analysis and control unit for use in an operating mode when the confirmation signal is received.

11. The protective arrangement according to claim 9, wherein the actuating unit and/or the confirmation unit comprises a button.

12. The protective arrangement according to claim 11, wherein the LED and the button are integrated in a modular unit.

13. A protective arrangement for protecting an electrical device against an overload current, comprising:
an input at which a current is supplied to the protective arrangement by a power supply;
an output via which the current is transferred in the form of an output current to the electrical device;
a safety switch in a power line between the input and the output, which safety switch is configured to disconnect the power line when a set tripping current is exceeded; and
a current sensor configured to measure the current in the power line when the electrical device is connected, the current sensor being configured to set the tripping current, on the basis of the measured current, to a value that is greater than the measured current by a specified difference,
wherein the safety switch comprises a transistor that is configured to be actuated by a comparator, both the measured current in the form of an actual value and the set tripping current in the form of a target value being supplied to the comparator as input signals, the output of the comparator being configured to actuate the safety switch such that it disconnects the power line if the actual value is greater than the target value.

* * * * *